(12) United States Patent
Yorita et al.

(10) Patent No.: US 9,001,528 B2
(45) Date of Patent: Apr. 7, 2015

(54) SHIELDED ELECTRONIC COMPONENTS AND METHOD OF MANUFACTURING THE SAME

(75) Inventors: Chiko Yorita, Fujisawa (JP); Yoshihide Yamaguchi, Yokohama (JP); Yuji Shirai, Saku (JP); Yu Hasegawa, Sagamihara (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 63 days.

(21) Appl. No.: 13/561,302

(22) Filed: Jul. 30, 2012

(65) Prior Publication Data
US 2012/0292772 A1 Nov. 22, 2012

Related U.S. Application Data

(63) Continuation of application No. 12/612,699, filed on Nov. 5, 2009, now abandoned.

(30) Foreign Application Priority Data

Nov. 7, 2008 (JP) .................................. 2008-286254

(51) Int. Cl.
*H05K 9/00* (2006.01)
*H01L 21/56* (2006.01)
(Continued)

(52) U.S. Cl.
CPC .......... *H01L 21/565* (2013.01); *H01L 23/3121* (2013.01); *H01L 23/3128* (2013.01); *H01L 23/552* (2013.01); *H01L 24/97* (2013.01); *H01L 25/0657* (2013.01); *H01L 25/50* (2013.01); *H05K 3/284* (2013.01); *H05K 9/0084* (2013.01); *H01L 21/568* (2013.01); *H01L 23/66* (2013.01); *H01L 25/165* (2013.01);
(Continued)

(58) Field of Classification Search
USPC ............... 361/816, 679.01, 679.02, 736, 739, 361/746, 748, 752, 753, 757, 760
See application file for complete search history.

(56) References Cited

U.S. PATENT DOCUMENTS

| | | | |
|---|---|---|---|
| 6,204,162 B1 * | 3/2001 | Yonemochi et al. | .......... 438/612 |
| 2005/0073625 A1 * | 4/2005 | Daiku et al. | .................... 349/64 |
| 2007/0175763 A1 | 8/2007 | Nagai et al. | |

FOREIGN PATENT DOCUMENTS

| | | |
|---|---|---|
| JP | 2004-297054 A | 10/2004 |
| JP | 2005-109306 A | 4/2005 |

(Continued)

OTHER PUBLICATIONS

Machine Translation of Takase et al., Japanese Patent Publication No. 2005-109306 (Apr. 21, 2005).*

(Continued)

*Primary Examiner* — Tremesha S Willis
(74) *Attorney, Agent, or Firm* — Miles & Stockbridge P.C.

(57) ABSTRACT

A shielded electronic component including a wiring board, at least one semiconductor chip mounted on a main surface of the wiring board, a sealant which seals the whole of an upper surface of the wiring board, and a nickel (Ni) plating film formed on an upper surface of the sealant is provided. The Ni plating film is formed on a palladium (Pd) pretreatment layer formed on the upper surface of the sealant with using high-pressure $CO_2$ in a state of protecting a back surface of the wiring board, and is electrically connected with an end portion of a ground wiring layer of the wiring board or a ground (GND) connection through-hole connected with the end portion of the ground wiring layer.

9 Claims, 15 Drawing Sheets

(51) Int. Cl.
  H01L 23/31   (2006.01)
  H01L 23/552  (2006.01)
  H01L 23/00   (2006.01)
  H01L 25/065  (2006.01)
  H01L 25/00   (2006.01)
  H05K 3/28    (2006.01)
  H01L 23/66     (2006.01)
  H01L 25/16     (2006.01)
  H05K 1/02      (2006.01)
  H05K 3/00      (2006.01)
  H05K 3/18      (2006.01)

(52) U.S. Cl.
  CPC ............ *H01L 2224/16225* (2013.01); *H01L 2224/48091* (2013.01); *H01L 2224/48227* (2013.01); *H01L 2224/73265* (2013.01); *H01L 2224/97* (2013.01); *H01L 2225/0651* (2013.01); *H01L 2924/01027* (2013.01); *H01L 2924/01029* (2013.01); *H01L 2924/01033* (2013.01); *H01L 2924/01046* (2013.01); *H01L 2924/01051* (2013.01); *H01L 2924/01074* (2013.01); *H01L 2924/01078* (2013.01); *H01L 2924/01082* (2013.01); *H01L 2924/14* (2013.01); *H01L 2924/1433* (2013.01); *H01L 2924/19041* (2013.01); *H01L 2924/19105* (2013.01); *H01L 2924/3025* (2013.01); *H05K 1/0218* (2013.01); *H05K 3/0052* (2013.01); *H05K 3/181* (2013.01); *H01L 24/48* (2013.01); *H01L 2924/01006* (2013.01); *H01L 2924/01045* (2013.01); *H01L 2924/014* (2013.01); *H01L 2224/32145* (2013.01); *H01L 2224/32225* (2013.01); *H01L 2924/15311* (2013.01)

(56) References Cited

FOREIGN PATENT DOCUMENTS

| | | |
|---|---|---|
| JP | 2005-322752 A | 11/2005 |
| JP | 2006-131769 A | 5/2006 |
| JP | 2006-165109 A | 6/2006 |
| JP | 2008-081800 A | 4/2008 |
| WO | WO 2004/064150 A1 | 7/2004 |

OTHER PUBLICATIONS

Japanese Office Action issued Oct. 23, 2012 (and English translation), in Japanese Patent Application No. 2008-286254.

\* cited by examiner

US 9,001,528 B2

SHIELDED ELECTRONIC COMPONENTS AND METHOD OF MANUFACTURING THE SAME

CROSS-REFERENCE TO RELATED APPLICATIONS

This application is a continuation of application Ser. No. 12/612,699 filed Nov. 5, 2009 now abandoned. The present application also claims priority from Japanese Patent Application No. JP 2008 -286254 filed on Nov. 7, 2008, the content of which is hereby incorporated by reference into this application.

TECHNICAL FIELD OF THE INVENTION

The present invention relates to a shielded electronic component and a method of manufacturing the same. More particularly, the present invention relates to mounting of electric components including semiconductors such as a semiconductor-mounting electronic component which requires a shielding structure for avoiding adverse effects of ambient radio waves and electromagnetic noise from semiconductors, and a semiconductor mounting electronic component which requires shielding of noise generated from itself.

BACKGROUND OF THE INVENTION

A mobile phone will be exemplified to describe a mounting structure of electronic components including semiconductors.

Various electronic components are mounted on a mounting board inside a mobile phone. Functions of the board are largely classified into the following configurations.

That is, an RF (radio frequency) unit which receives high-frequency waves from a cell site (base station) by an antenna and reduces the frequency to make it low enough to be processed and/or amplifies the high-frequency waves to radio waves transmittable to the cell site, and a baseband unit including: a CPU (central processing unit) which processes received signals; various application processors which process images, audio etc.; and/or a memory device (memory). Frequencies of the transceived radio waves processed by the RF unit are as follows.

First, frequencies used in respective communication standards in Japan are: 800 MHz band for PDC (personal digital cellular); 1.5 MHz band for cdmaOne (code division multiple access one); 1.7 GHz band for CDMA200, and 2100 MHz band for W-CDMA (wideband code division multiple access).

Also, frequencies used in the global communication system GSM (global system for mobile communications) systems being mainly used in Europe are 900 MHz band and 1800 to 1900 MHz band. Frequencies used in the communication system D-AMPS (digital advanced mobile phone system) being used in United States and Canada are in 800 MHz band and 900 MHz band.

A component which amplifies transmitted waves so that the waves have respective frequencies of the above for transmitting radio waves from a phone to a cell site is power amplifier. There are various communication systems/frequency compatible types by way of selecting and combining frequencies from those mentioned above depending on the ways of use and regions. Since the output characteristics of a transistor(s) which amplifies radio waves in the power amplifier are nonlinear, noise of second harmonic and third harmonic is generated in the output of the part desired to have ensured efficiency.

While the circuit is designed to remove the noise on the transmitted waves by a filter, noise is generated from the power amplifier component itself, and it may negatively affect peripheral electronic components including semiconductors.

To describe high-frequency devices having a wireless function, mobile phones in Japan will be exemplified. Except for the power amplifier, there are near field wireless communication by infrared communication and/or Bluetooth, a TV tuner for the one-segment broadcasting in 400 MHz band, an FM/AM radio tuner, etc. In the future, various wireless communications such as WiFi (wireless fidelity) wireless LAN are expected to be mounted. Therefore, it is necessary to concern interactive influence of electromagnetic noise generated from these electronic components.

Second, a CPU that achieves main function in a phone, a main memory device, various application processors handling images, video, music, security etc., various memories, and/or passive components are mounted in the baseband unit. Clock frequencies of these application processors have been increased year by year. When they are mounted separately from an external memory, instruction error is easily generated due to disturbance noise.

In view of preventing the error, design load reduction, power consumption reduction, and mounting area reduction, a structure of stacking and packaging a processor and a memory has been increasingly employed. While current flows in a bonding wire when transmitting/receiving high-speed signals between an application processor and a memory, the wire part becomes an antenna to generate electromagnetic waves, so that a magnetic field and an electric field (noise) are generated in the line path of the current.

As to a countermeasure for noise of a mounting board in a mobile phone, when there is relatively a margin in the arrangement of semiconductor components and so the components which are feared to have noise interference can be separately mounted, normally, a metal cap is mounted in a large area size per function block unit so that a shielding effect can be obtained.

However, in the trend of high functionality and ultra-thin frame of recent mobile phones, the design is made to eliminate dead space as making a sterically mounting arrangement by packing components into available space. In such a design, it is difficult to ensure a mounting area for large components, even for the indispensable shielding cap. However, there has been a problem of posing erroneous operation due to influence of noise in removing the metal cap and neighboring a semiconductor for high-speed communication, a semiconductor for high-speed image processing and a power amplifier of an RF circuit as a single package without a shield.

For example, as to an electronic component aiming for individual shielding, as described in Japanese Patent Application Laid-Open Publication No. 2005-322752 (Patent Document 1), a structure in which a metal cap is put on a mounting board with respect to a module in which an IC and/or passive components are mounted on a board is generally used to solve the above problem.

However, in this structure, the inside of the cap is not resin-molded, and thus there is a difficulty in mass production when the resin molding process of large semiconductor packages to be formed with resin molding is changed to a metal cap structure, because the cost of the metal cap is expensive.

In addition, as an area of a substrate for ensuring a thickness of the metal cap and/or a mounting area is necessary, the electronic parts cannot be down-sized. Also, while the electronic components are mounted on a board of a product by solder reflow after shipment, one of typical lead-free solders to be used in the reflow is Sn3Ag0.5Cu solder paste.

A temperature of a reflow process in which a SnAgCu-based Pb-free solder paste is printed and the solder is heated to be melted is set such that a temperature higher than or equal to 217° C. which is a melting point of the Sn3Ag0.5Cu solder is ensured for about 40 to 60 seconds, for example.

In this time, the peak temperature is set to about 260° C. It is predicted that the electronic components will be subjected to the heating process at least once and three times at the most for connection of the components themselves. Incidentally, the three-time heating process is effects of connection of the components themselves, repair heating of adjacent components, and heating for mounting new components.

The electronic components may absorb water on the way of transfer. On that assumption, the JEDEC (joint electron device engineering council) standard sets a reliability guarantee standard of sensitivity level with respect to humidity to which the product is exposed in order to guarantee that there is no problem in the connecting points by performing heating complying with reflow after a water absorption test for a fixed period.

For example, JEDEC LEVEL 2 preconditions a reflow test of "subjecting the component in a relatively humid environment of 85° C./85% for 168 hours followed by reflow at 260° C. for three times." If the component meets JEDEC LEVEL 2, a solder reflow connection of the component is guaranteed after leaving the product in a relatively humid atmosphere at 30° C. or lower and in 85% relative humidity of actual environment. If the electronic component does not meet JEDEC LEVEL 2, volume of water sneaked into the electronic component is expanded when the electronic component is assembled and mounted by reflow, resulting in a defect of exfoliation of an adhering surface and/or a connection portion inside the component.

Accordingly, there have been conventional methods which satisfy downsizing and high reliability in electronic components by forming a metal plating film, which can substitute the metal cap, on a mold resin.

Japanese Patent Application Laid-Open Publication No. 2004-297054 (Patent Document 2) and Japanese Patent Application Laid-Open Publication No. 2005-109306 (Patent Document 3) describe such methods of forming an electromagnetic shield to a semiconductor package.

Patent Document 2 discloses an example of an electromagnetic shield structure in which a shielding film is formed to cover the surface of a semiconductor device including semiconductor ICs mounted on a multilayer wiring board and subjected to resin molding, and the shielding film is electrically connected to a cut wiring portion(s) protruding at an edge portion(s) of the multilayer board. It is described that the shielding film is formed of a conductive paste by plating, sputtering, or CVD.

Also, Patent Document 3 discloses a method for achieving improvement of package shielding and reduction in size, height and weight of electronic components, and providing a sufficient shielding effect even to high frequencies, the method providing: a circuit board having a ground pattern; an electronic component mounted on a top surface of the circuit board; a sealant of an epoxy resin containing inorganic filler molding the mounted components; and a metal shield layer formed of a nonelectrolytic Cu (copper) plating layer, an electrolytic Cu plating layer, and an anti-oxidation layer for copper of these layers, the metal shield layer being formed on the sealant and connected with the ground pattern.

SUMMARY OF THE INVENTION

As to such a mounting configuration formed with a shield plating, the formed package was made to absorb moisture in an 85° C./85% RH (relative humidity) atmosphere and a reflow test was performed to make the maximum temperature to 260° C. After the test, a failure occurs such that the plating film for shielding formed on the package surface was expanded and exfoliated. This exfoliation occurred between the surface of the mold resin and the plating film.

Also, in a temperature cycle test (e.g., −30° C./125° C. in 30 min. cycle) after a reflow test in order to proving reliability, a failure occurs such that the shielding film formed by applying a paste has a deteriorated shielding property as the adhesiveness with the layer connected with the ground is decreased.

It is supposed that a ratio of metal bonding surface area and a ratio of contact surface area of the shielding metal that is electrically connected with the electrode and the ground wiring connected with a side and/or a surface of the module board are decreased due to deterioration by the temperature cycle test.

Micro breaking inside the material due to local strain caused by a difference in linear expansion coefficient of the material due to temperature rising/falling in the temperature cycle test starts to occur between the ground metal and the shielding metal such as: a metal connection by a board wiring material/plating, a contact bonding of the metal in the paste; a partial coupled portion between metal oxides, between a metal oxide and a metal portion, or between metals; and/or an adhered portion of metal and/or metal oxide and an organic polymer composite.

When electromagnetic waves pass through the broken length, electromagnetic waves cannot be shielded. When a hole of 300 μm diameter is opening in a film or a metal cap having a sufficient shielding effect, the wavelength for the communication wave of 900 MHz for mobile phones is 33.3 cm and so the diameter 300 μm is about 1/100 of the wavelength, and thus there is no influence on the shielding effect even if a hole at such a level is opening.

Meanwhile, empirically, a hole in, e.g., a slit-like shape in a shield allows electromagnetic noise to pass through. A slit-like crack generated by deterioration depending on usage environment causes reduction of the shielding effect even when it is short.

As described above, there is a problem of generating connection deterioration between the shielding metal or metal-containing material and the ground electrode.

Here, while the plating used for the shielding material can be electrolytic plating or non-electrolytic plating, electrolytic plating requires electrodes and formation of a seed electrode is indispensable with respect to a non-conductive plated material.

Generally, seed electrode formation to plastic is performed by non-electrolytic plating. Thus, a process of the formation will be described. To perform non-electrolytic Ni (nickel) plating to a plastic material, first, degreasing/cleaning of a plated surface is performed and roughening is performed if needed, and a processing of Pd (palladium) seed electrode formation is performed as a pretreatment of the plating process. A metal complex absorbed on the plated surface is reduced to deposit metal Pd.

Next, non-electrolytic Ni plating is grown using that Pd as core. For example, in the process of performing non-electrolytic plating, plating is carried out by subjecting the to-be-plated member to the steps of degreasing, cleaning, soft etching, cleaning, acid cleaning, rinsing, non-electrolytic Ni plating, and rinsing. The formed non-electrolytic plating film itself may be used for the shielding film, and, if necessary, an electrolytic plating can be formed on the non-electrolytic plating film using the Ni plating film as a seed electrode.

Meanwhile, when the non-electrolytic plating is formed on a mold resin, the mechanical strength relating to adhesiveness between the non-electrolytic plating film and the mold resin depends on the anchor effect of the plating film and an unevenness of the plastic surface at the micro level. Therefore, the expansion of the plating film generated when a moisture absorption reflow reliability test on the electronic component as described above is performed causes exfoliation at the interface of the mold resin and the plating film having weak adhesiveness.

To solve the problem of deterioration of the shield metal film (plating expansion/exfoliation and/or deterioration of the connection portion) of the electronic component as described above, for example, Pd metal particles are formed to the mold resin surface with a fixed diffusion depth from the surface, which is a pretreatment of the shield plating film. The formation of Pd metal particles is performed in a pressured state in the presence of high-pressure $CO_2$.

For example, Japanese Patent Application Laid-Open Publication No. 2006-131769 (Patent Document 4) discloses a method of forming a plastic structure and the structure in which a Pd metal complex is dissolved in a supercritical fluid to contact with a plastic surface, a metal element as a plating seed electrode exists in the plastic at a 5 nm or smaller depth from the surface and at 5 atomic % or higher.

By forming the layer, the anchor effect of the non-electrolytic Ni plating to the resin thereafter can be further stronger. The non-electrolytic Ni plating may be done by a normal method or a non-electrolytic Ni plating method having Ni dissolved in high-pressure $CO_2$ in the same manner with the Pd treatment. The latter method forms a film which forms more diffusion layer because the plating solution itself permeates inside the mold resin.

When actually performing the Pd pretreatment and the non-electrolytic Ni plating treatment both using the high-pressure $CO_2$ in a supercritical state, the electronic component having components and an IC(s) mounted on a printed board and formed with mold resin is put under high pressure. At this time, infiltration of the high-pressure $CO_2$ into an adhesive layer of the printed board and/or the glass cloth layer at a side edge portion of the cut board, and dissolution of the resin around the glass cloth to decompose the board into pieces etc. have been concerned.

If the solution permeates into the depth of the board through these paths, that is, if Pd metal is deposited and non-electrolytic Ni plating is deposited, short-circuiting occurs inside the board. Similarly, if the solution permeates at the interface of the mold resin and the board, short-circuiting occurs between the electrodes on the board surface. It is feared to decompose the structure of the module due to infiltration of the $CO_2$ solution into the bonding portion of the board and the mold resin and/or the cut portions of the sides of the board.

Also, migration upon using the product due to metal ions infiltrated into the board is concerned.

Since a chamber to use the high-pressure $CO_2$ solution is for a batch processing system, the electronic component is necessary to be wholly dipped in the solution. Therefore, the back surface of the component is unwillingly plated, resulting in a problem of short-circuiting between signal terminal electrodes and/or ground terminal electrodes.

An adhesive sheet generally in a sheet-like shape used as a protective film of the back surface of the plated body is dissolved in the $CO_2$ in a supercritical state to be unable to protect the back surface, and thus there has been a problem of insufficient covering effect.

As described above, as to structure, reliability, and a manufacturing method of a shielding metal film and/or a shielding metal-containing film having reliability in reflow resistance of an electronic component, there have been problems of weakness in adhesiveness of a generally used non-electrolytic plating film to a mold resin, infiltration of a solution from side surfaces and/or cut plane of the plating, and impossibility of protection of a back surface of the plating by simply adhering a sheet.

Accordingly, a preferred aim of the present invention is to provide an electronic component having a shield with a high reliability in reflow resistance on one side thereof by forming a plating film having no infiltration of $CO_2$ from side surfaces of a board, a high migration reliability, and significantly improved adhesiveness by forming a plating base under high-pressure $CO_2$.

The above and other preferred aims and novel characteristics of the present invention will be apparent from the description of the present specification and the accompanying drawings.

The typical ones of the inventions disclosed in the present application will be briefly described as follows.

That is, a typical one of the inventions is such that a metal plating film is formed on a pretreatment layer using high-pressure $CO_2$ formed only on a top surface of a sealant with protecting a back surface of a wiring board, the metal plating film being electrically connected with a ground-connection through-hole connected to an edge portion of a ground wiring layer on a side surface of the wiring board or an edge portion of the ground wiring layer.

The effects obtained by typical aspects of the present invention will be briefly described below.

That is, an advantage obtained by the typical one of the inventions is to manufacture an electronic component having a shield with a high reliability in reflow resistance on one side thereof by forming a plating film having no infiltration of $CO_2$ from side surfaces of a board, a high migration reliability, and significantly improved adhesiveness by forming a plating base under high-pressure $CO_2$.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

(First Embodiment)

Figure 1:
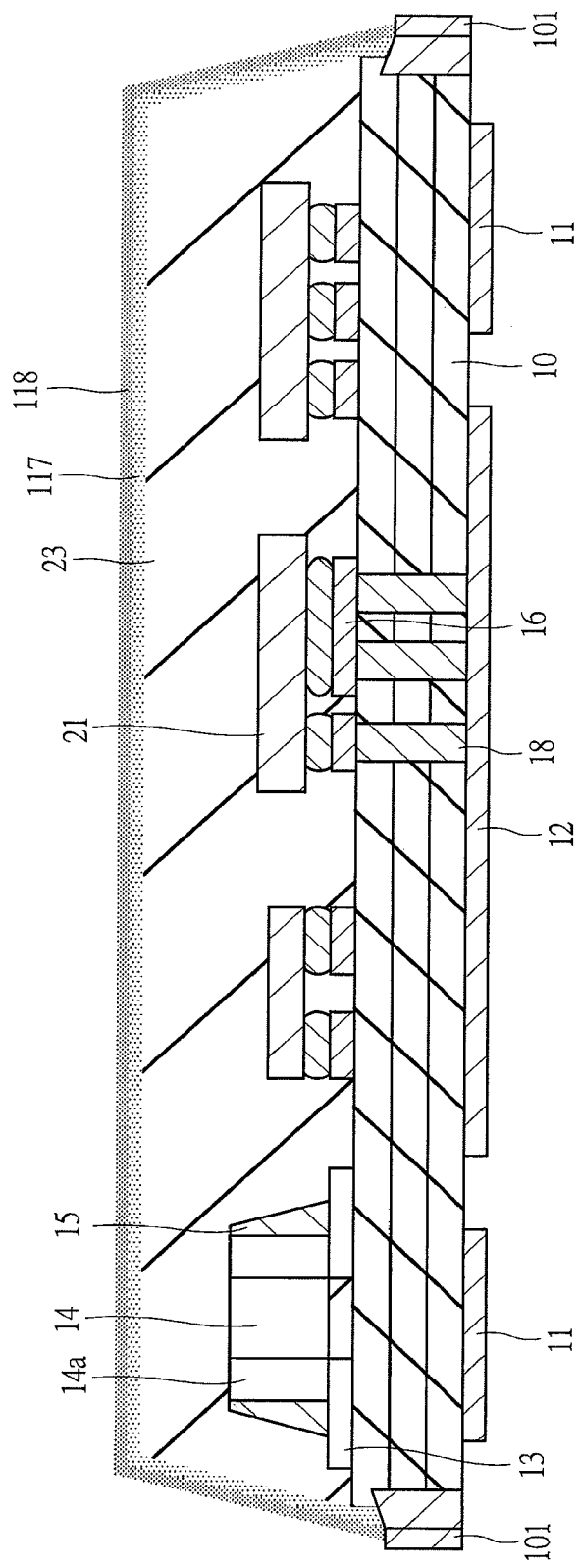
FIG. 1 is a cross-sectional view illustrating a structure of a shielded electronic component according to a first embodiment of the present invention.

With reference to FIG. 1, a structure of a shielded electronic component according to a first embodiment of the present invention will be described. FIG. 1 is a cross-sectional view illustrating the structure of the shielded electronic component according to the first embodiment of the present invention and illustrating a structure of a power amplifier module.

In FIG. 1, a power amplifier module which is the shielded electronic component includes, when the external structure is viewed, a rectangular wiring board 10, a sealant 23 formed with overlapping on a surface (main surface) of the wiring board 10, a plurality of wirings 11 provided to a back surface of the wiring board 10, and a GND (ground) external wiring 12.

In addition, the sealant 23 is shielded by a Pd pretreatment layer 117 of a Pd complex and a Ni plating film 118. To edge portions of the wiring board 10, GND connection through-holes 101 for a GND wiring layer (not illustrated) or a shield connected to the GND wiring layer are formed.

Also, a wiring 13 is formed on the surface of the wiring board 10 in the power amplifier module, and a chip component is formed to the wiring 13. The chip component 14 is configured by a passive component such as a resister or a capacitor, and an electrode 14a of the chip component 14 is electrically connected with the wiring 13. Further, a wiring 16 is connected to the GND external wiring 12 formed to the back surface of the wiring board 10 through a via 18 formed inside the wiring board 10. Moreover, a semiconductor chip 21 is formed on the surface of the wiring board 10.

In the power amplifier module, in assembling thereof, electronic components including the semiconductor chip 21 are mounted on a multichip board on which a plurality of the wiring boards 10 are aligned, and thereafter, the sealant 23 is formed with a resin having a fixed height so as to cover the mounted electronic components.

And, the multichip board to which the sealant 23 is formed is cut in a matrix into pieces so that a plurality of power amplifier modules are formed at once.

In this manner, side surfaces of the wiring board and side surfaces of the sealant 23 coincide, and edge portions of the sealant 23 are not positioned outside the edge portions of the wiring board 10 in the structure.

The wiring board 10 is configured by, for example, a printed wiring board, and it has a structure of attaching a plurality of dielectric layers (insulating layers) together. Predetermined wirings are formed to the surface (main surface), back surface, and the inside of the wiring board, and a part of the wiring formed to the surface of the wiring board 10 and a part of the wiring formed to the back surface of the wiring board 10 are electrically connected through the via 18 extending in a thickness direction of the wiring board 10.

Incidentally, while the number of the dielectric layers is three in the present embodiment, it is needless to say that the number is not limited to this.

Next, with reference to FIGS. 2 to 9, a method of manufacturing the shielded electronic component according to the first embodiment of the present invention will be described. FIGS. 2 to 9 are explanatory diagrams for describing the method of manufacturing the shielded electronic component according to the first embodiment of the present invention.

Figure 2:
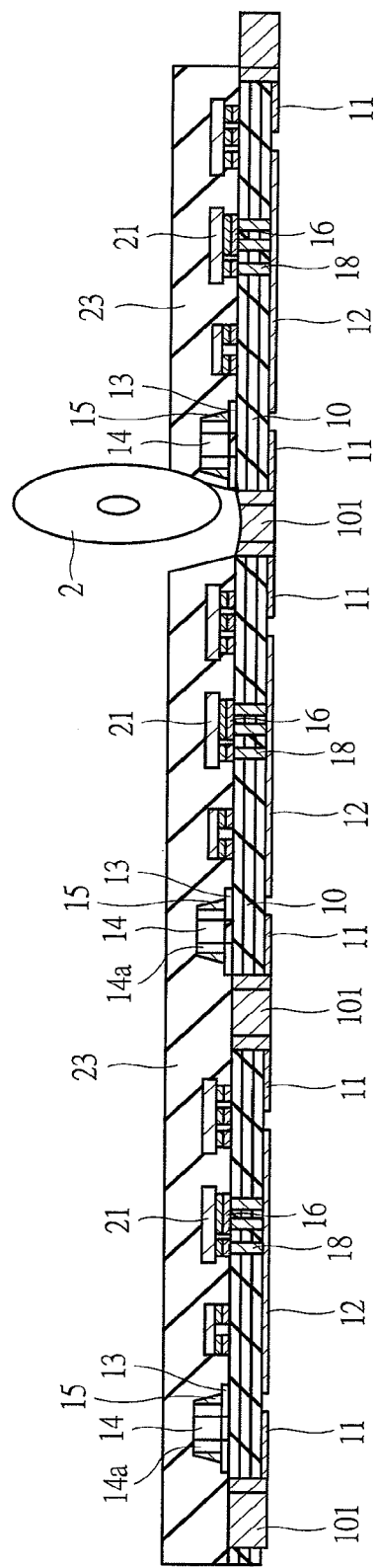
FIG. 2 is an explanatory diagram for describing a method of manufacturing the shielded electronic component according to the first embodiment of the present invention.

First, as illustrated in FIG. 2, the sealant 23 by mold resin is cut in by a dicing blade 2 until reaching the GND wiring layer (not illustrated) of the wiring board 10 or the GND connection through-hole 101 electrically connected with the GND wiring layer.

Figure 3:
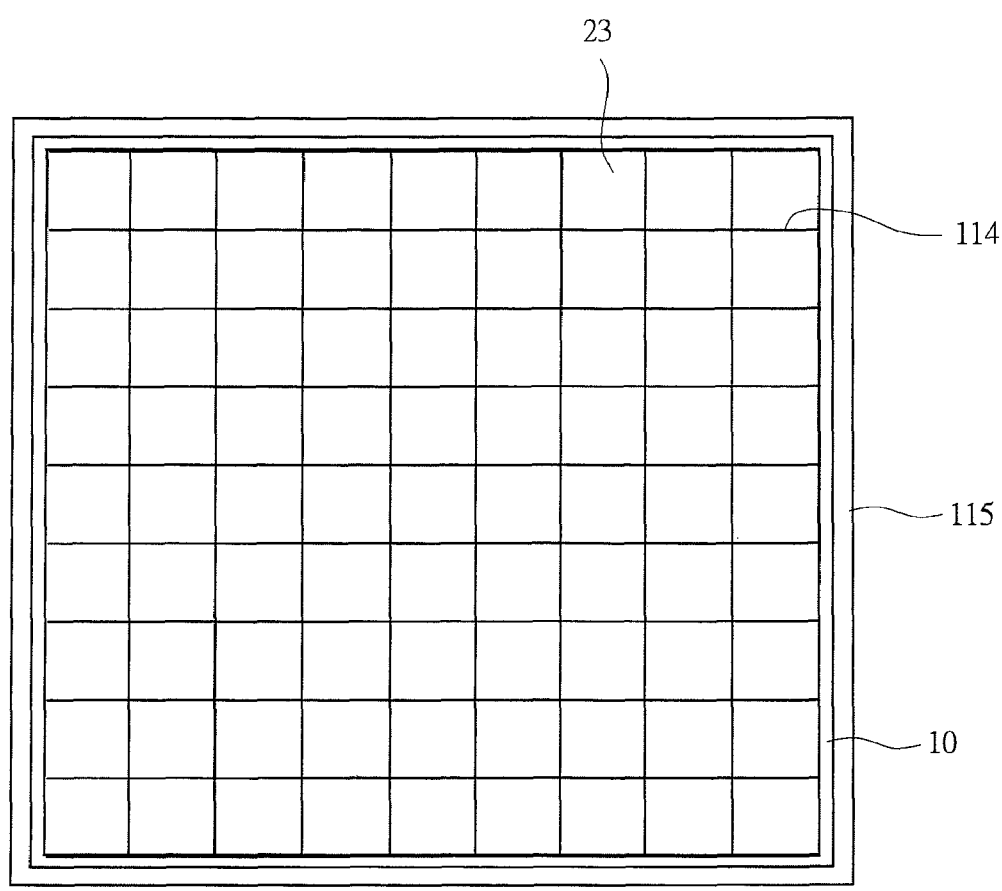
FIG. 3 is an explanatory diagram for describing the method of manufacturing the shielded electronic component according to the first embodiment of the present invention.

A top view upon half-cut dicing singulated pieces on the shield in this manner is illustrated in FIG. 3.

In FIG. 3, a mold resin, half-cut dicing grooves 114 which are formed by the half-cut dicing until they reach the through-hole of the board, and peripheral adhesive portion 115 adhering the periphery of the wiring board 10 are formed on the wiring board 10.

It is sufficient as long as the half-cut dicing groove 114 reaches a ground layer among some ground layers of the wiring board 10, i.e., reaching a ground layer to make the best configuration in consideration of performance of the module.

Figure 4:
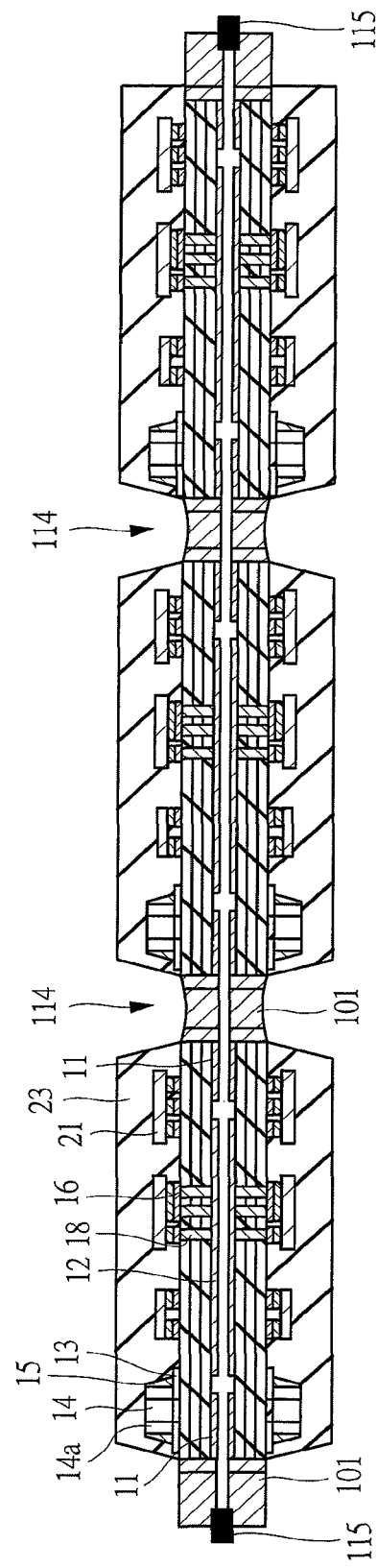
FIG. 4 is an explanatory diagram for describing the method of manufacturing the shielded electronic component according to the first embodiment of the present invention.

FIG. 4 illustrates a cross-sectional view of the wiring boards 10 attached to each other by their back surfaces to protect the back surfaces and fixed by an epoxy-based adhesive (or curable adhesive) as the peripheral adhesive portion 115 being cured around the complete periphery.

Figure 5:
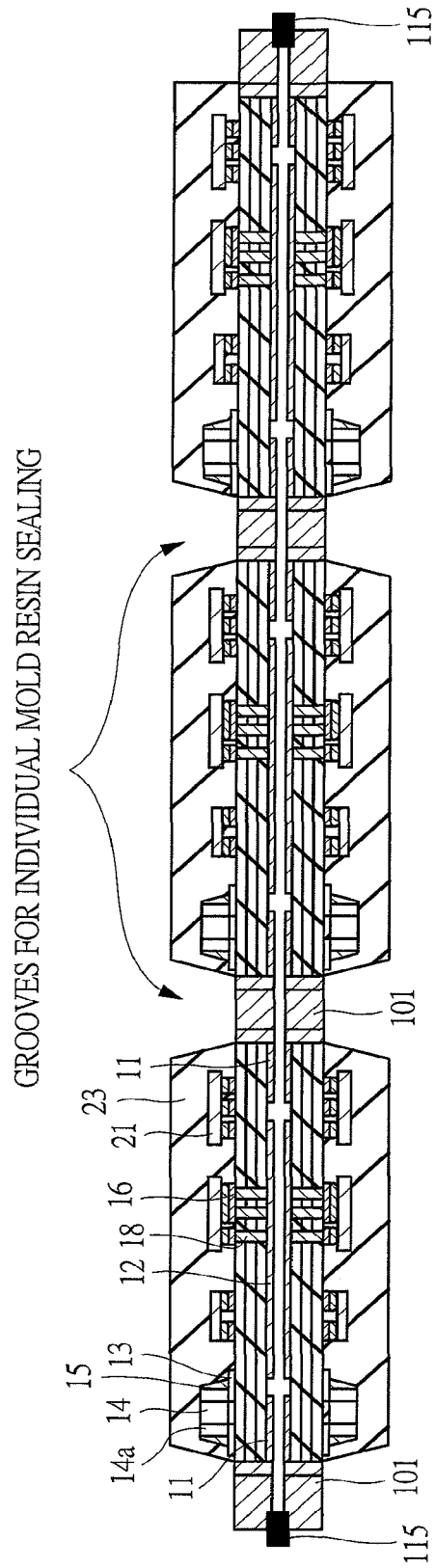
FIG. 5 is an explanatory diagram for describing the method of manufacturing the shielded electronic component according to the first embodiment of the present invention.

Also, as illustrated in FIG. 5, instead of half dicing, it can be a chocolate-bar like sealing as the sealant 23 such as mold resin is formed into a block per individual PKG (package).

Figure 6:
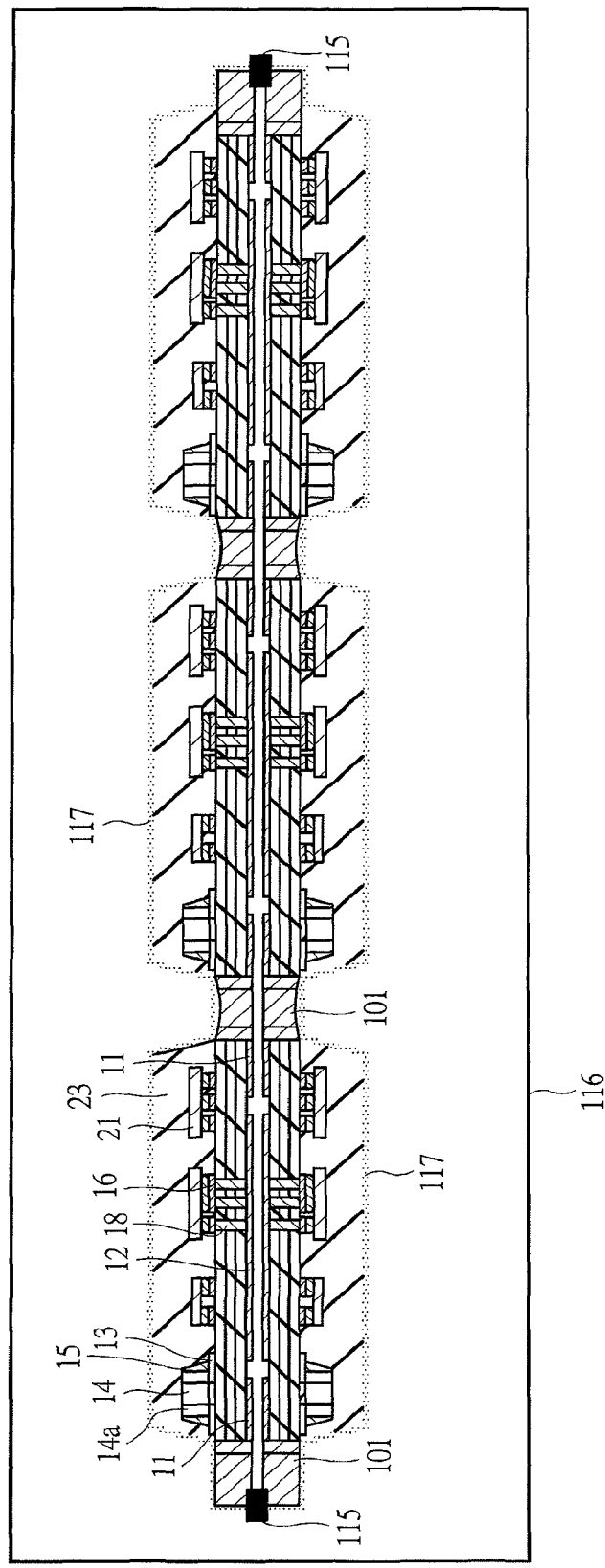
FIG. 6 is an explanatory diagram for describing the method of manufacturing the shielded electronic component according to the first embodiment of the present invention.

Then, edge portions of the two boards formed by half dicing or two boards formed by individual molding are adhered by an adhesive and cured followed by a base treatment as being introduced into a chamber 116 in which a Pd complex (plating base) exists as being dissolved in high-pressure $CO_2$ as illustrated in FIG. 6.

A Pd complex subjected to a reduction treatment permeates a surface of the sealant 23 to several nanometers or more in a depth direction of the sealant 23. Alternately, the surface of the sealant 23 has holes caused by vacancy of $SiO_2$ particles included in the sealant 23 and/or space of an interface of the resin and $SiO_2$ particle, and thus the Pd complex permeates deeply into a depth direction of the hole and space.

Therefore, Pd particles to be the seed electrode of plating permeate deeper than those in a normal Pd treatment. The Pd pretreatment layer having a depth to some extent becomes a base for giving the anchor effect to the Ni plating film 118.

In addition, a plating treatment thereafter can be performed by the normal non-electrolytic Ni plating in the atmosphere (the air) or high-pressure $CO_2$ dissolving non-electrolytic Ni plating. In the actual usage, forming the non-electrolytic plating 118 by a plating solution dissolved in high pressure $CO_2$ makes the Pd complex permeate the sealant 23 deeper, and thus forming the non-electrolytic Ni plating film 118 by non-electrolytic Ni plating solution dissolved in high-pressure $CO_2$ can form a package more excellent in humidity-resistance reflow reliability as the shield plating.

Figure 7:
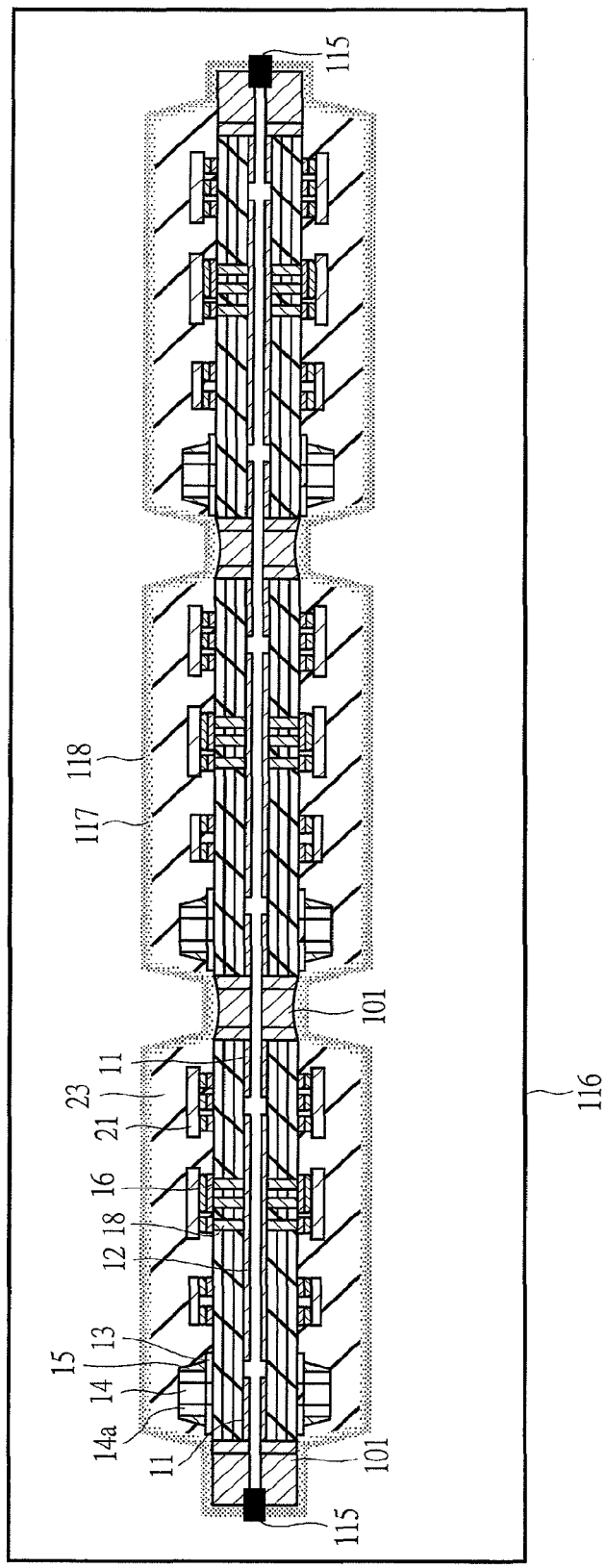
FIG. 7 is an explanatory diagram for describing the method of manufacturing the shielded electronic component according to the first embodiment of the present invention.
Figure 8:
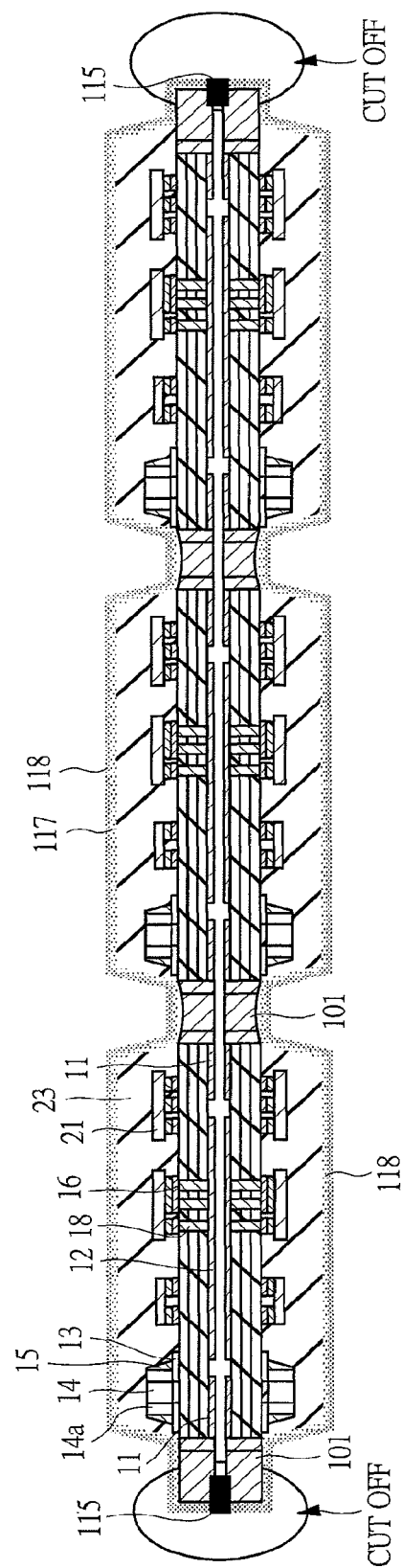
FIG. 8 is an explanatory diagram for describing the method of manufacturing the shielded electronic component according to the first embodiment of the present invention.
Figure 9:
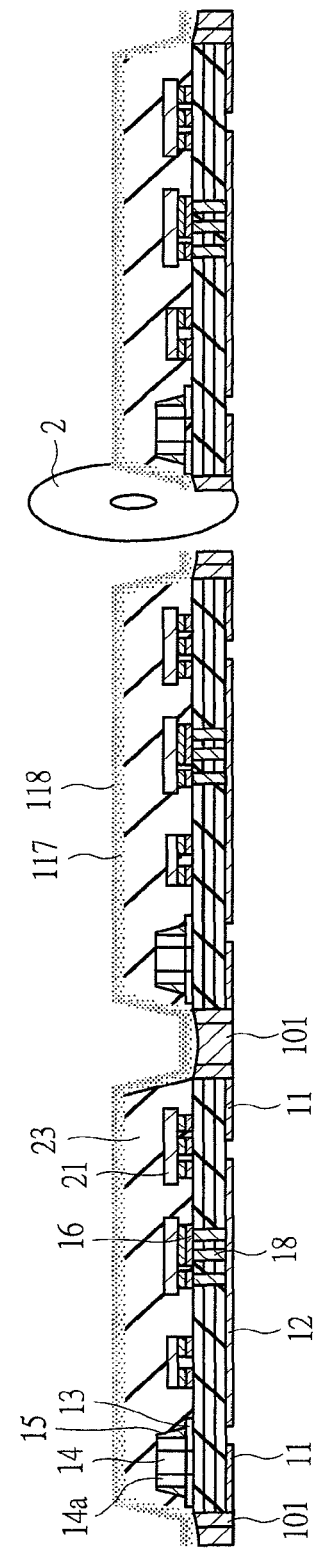
FIG. 9 is an explanatory diagram for describing the method of manufacturing the shielded electronic component according to the first embodiment of the present invention.

After the plating treatment illustrated in FIG. 7, the adhered portion of the periphery are cut off as illustrated in FIG. 8, and the each sheet is cut into singulated pieces by full-cut dicing as illustrated in FIG. 9.

The electronic component manufactured in the manner as described above to be a package with a electromagnetic noise shield which is not affected by noise from other semiconductors and does not let own noise out to the outside, the electric component having a plating film having a dramatically improved adhesiveness formed by forming the plating base under high-pressure $CO_2$, and having a shield with a high reflow resistance reliability on one surface can be provided.

(Second Embodiment)

A shielded electronic component according to a second embodiment has the semiconductor chip 21 of the first embodiment mounted by face-up mounting.

Figure 10:
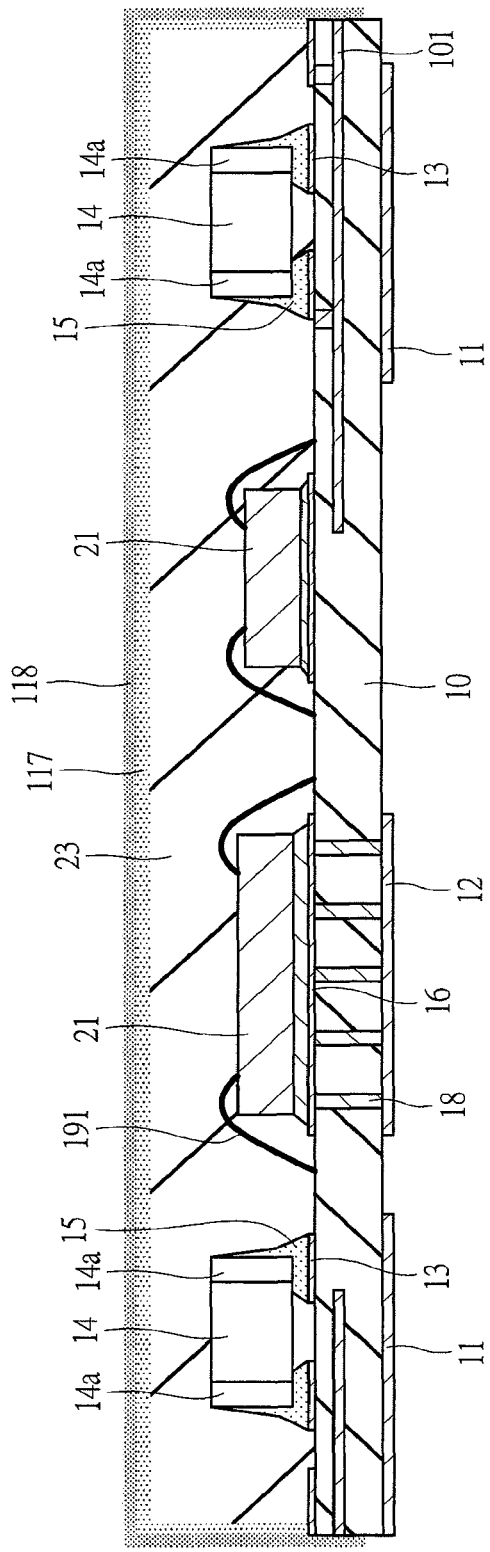
FIG. 10 is a cross-sectional view illustrating a structure of a shielded electronic component according to a second embodiment of the present invention.

With reference to FIG. 10, a structure of a shielded electronic component according to the second embodiment of the present invention will be described. FIG. 10 is a cross-sectional view illustrating a structure of the shielded electronic component according to the second embodiment of the present invention, and illustrates a structure of a power amplifier module.

In FIG. 10, a wiring 13 is formed to a surface of a wiring board 10 in the power amplifier module, and a chip component 14 is formed to be connected to the wiring 13. The chip component 14 is configured by a passive component such as a resistor or capacitor, and an electrode 14a of the chip component 14 and the wiring 13 formed to the wiring board 10 are electrically connected by a solder 15.

Also, a wiring 16 is connected to a GND external wiring 12 formed to a back surface of the wiring board 10 through a via 18 formed inside the wiring board 10. Further, the semiconductor chip 21 is mounted on the surface of the wiring board 10.

As illustrated in FIG. 10, the semiconductor chip 21 is mounted having a device-forming surface thereof facing upwards (face-up) on the wiring board 10. Further, the power amplifier module in the present embodiment is formed with a sealant 23 formed of a resin or the like to cover the chip component 14 and the semiconductor chip 21 mounted on the wiring board 10.

The components mounted on the module illustrated in FIG. 10 include an IC mounted face up and are connected to the wiring 13 of the wiring board 10 by a wire bonding 191.

Other than that, the manufacturing method and shielding method are the same with those of the first embodiment.

Also in the present embodiment, in the same manner with the first embodiment, the electronic component manufactured in the manner as described above to be a package with a electromagnetic noise shield which is not affected by noise from other semiconductors and does not let own noise out to the outside, the electric component having a plating film having a dramatically improved adhesiveness formed by forming the plating base under high-pressure $CO_2$, and having a shield with a high reflow resistance reliability on one surface can be provided.

(Third Embodiment)

A shielded electronic component according to a third embodiment has the semiconductor chip 21 formed with a plurality of stacked semiconductors and mounted by face-up mounting.

Figure 11:
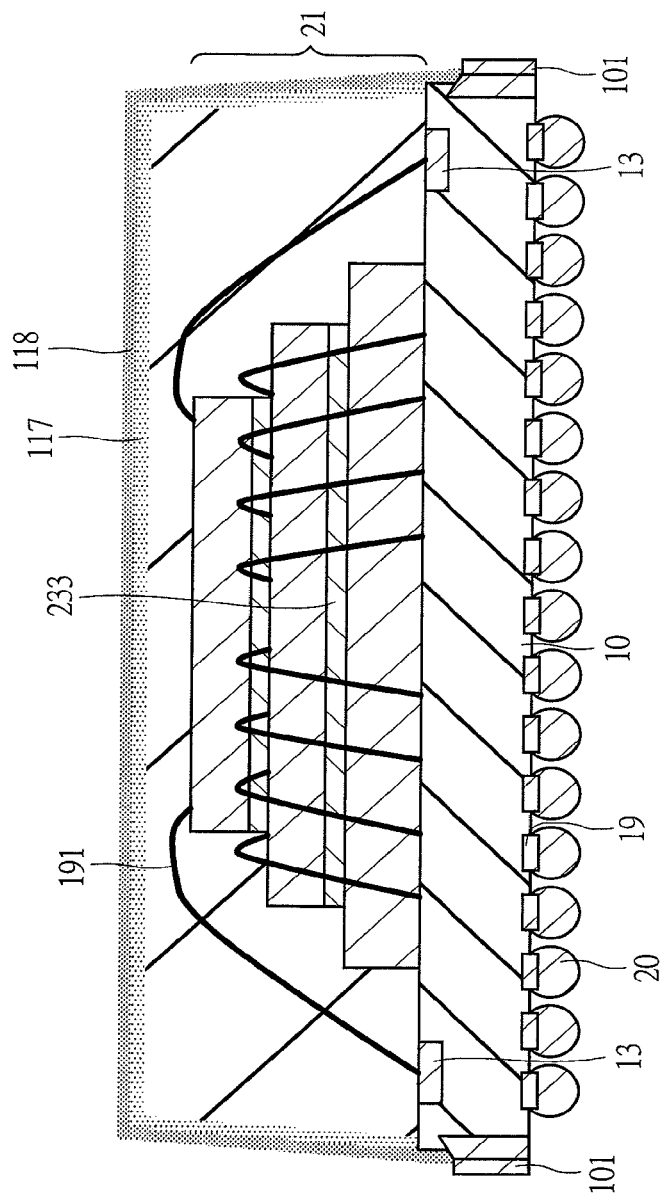
FIG. 11 is a cross-sectional view illustrating a structure of a shielded electronic component according to a third embodiment of the present invention.

With reference to FIG. 11, a structure of the shielded electronic component according to the third embodiment of the present invention will be described. FIG. 11 is a cross-sectional view illustrating the structure of the shielded electronic component according to the third embodiment of the present invention, and illustrating a generally used package. The package is a package of only for a memory, and/or a semiconductor package composed of an ASIC and a memory etc., for example.

In FIG. 11, the semiconductor chip 21 composed of a plurality of stacked semiconductors attached by a die-attach film 233 having its device forming surface facing upwards (face-up) is stacked on a wiring board 10.

The semiconductor chip 21 and the wiring board 10 are electrically connected to a wiring 13 on a surface of the wiring board 10 by a wire bonding 191. The top of the wiring board 10 is sealed by a sealant 23 of a mold resin or the like, and a Pd pretreatment layer 117 of a Pd complex permeated in an ultrahigh-pressure $CO_2$ solvent and a Ni plating film 118 are formed on the sealant 23, and the plating is connected to GND connection through-holes 101 formed at side surfaces of the wiring board 10. This structure is a BGA (ball grid array) type package in which a solder 20 is mounted to terminal electrodes 19 on the back surface.

Other than that, the manufacturing method and shielding method are the same with those of the first embodiment.

Also in the present embodiment, in the same manner with the first embodiment, the electronic component manufactured in the manner as described above to be a package with a electromagnetic noise shield which is not affected by noise from other semiconductors and does not let own noise out to the outside, the electric component having a plating film having a dramatically improved adhesiveness formed by forming the plating base under high-pressure $CO_2$, and having a shield with a high reflow resistance reliability on one surface can be provided.

(Fourth Embodiment)

A shielded electronic component according to a fourth embodiment has a protective film for protecting the back surface of the wiring board 10 as being applied to the back of the wiring board 10 instead of attaching back surfaces of the wiring boards 10 for protecting the back like the first embodiment.

With reference to FIGS. 12 to 15, a method of manufacturing the shielded electronic component according to the fourth embodiment of the present invention will be described. FIGS. 12 to 15 are explanatory diagrams for describing the method of manufacturing the shielded electronic component according to the fourth embodiment of the present invention.

First, in the same manner with the first and second embodiments, the sealant 23 of a mold resin or the like is cut in until reaching the GND wiring of the wiring board 10 or an electrode connected with the GND wiring by dicing. A top view of the electronic component after the half-cut dicing into singulated pieces on the shield in this method is the same with that in FIG. 5 of the first embodiment.

Figure 12:
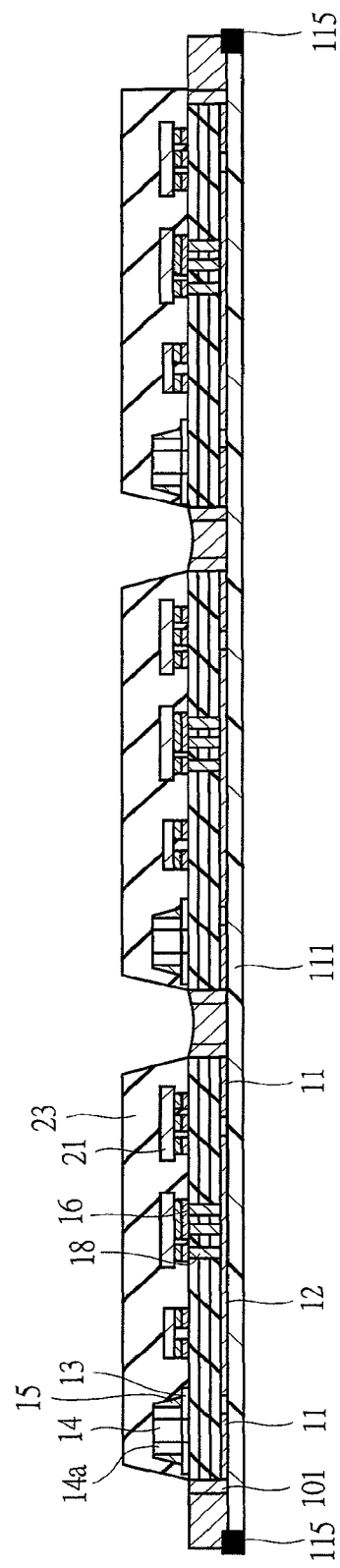
FIG. 12 is an explanatory diagram for describing a method of manufacturing a shielded electronic component according to a fourth embodiment of the present invention.

A cross-sectional view of the electronic component having a protective film 111 of an UV film or the like being applied to protect the back surface of the wiring board 10 formed in the manner as described above and having the whole periphery fixed by curing an epoxy-based adhesive (or curing adhesive) as the periphery adhesive portion 115 is illustrated in FIG. 12.

Note that there is no problem when the steps illustrated in FIG. 2 and FIG. 3 are carried out first or the application step of the protective film 111 illustrated in FIG. 12 is carried out first.

Figure 13:
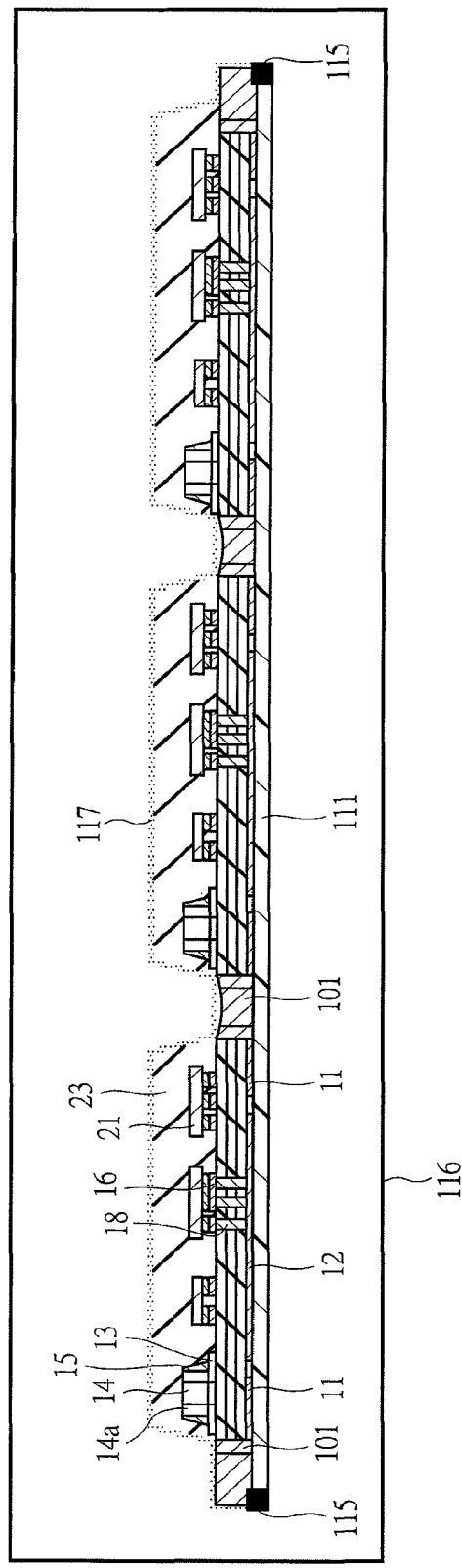
FIG. 13 is an explanatory diagram for describing the method of manufacturing the shielded electronic component according to the fourth embodiment of the present invention.

And, as illustrated in FIG. 13, after adhering and curing the epoxy-based adhesive or the like, the component is introduced into a chamber 116 in which a Pd complex (plating base) dissolved in high-pressure $CO_2$ exists, and the base treatment is performed.

Pd complex subjected to a reduction treatment permeates the surface of the sealant 23 by several nanometers or more in the depth direction. Alternately, the surface of the sealant 23 has holes caused by vacancy of $SiO_2$ particles contained in the sealant 23 and space of the interface of the resin and the $SiO_2$ particle, and thus the Pd complex permeates deeply into the holes and space in the depth direction of the hole and space.

Therefore, the Pd particles to be the seed electrode of plating permeate deeper than a normal Pd treatment. The Pd pretreatment layer 117 having a depth to some extent becomes the base for giving the anchor effect to the Ni plating film 118.

And, a plating treatment thereafter can be performed by normal non-electrolytic Ni plating in the atmosphere (the air), and also can be performed by high-pressure $CO_2$ dissolving non-electrolytic Ni plating. In actual usage, forming the non-electrolytic Ni plating film 118 by a plating solution dissolved in high-pressure $CO_2$ can form a package more excellent in humidity resistance reflow reliability as shield plating because the plating solution permeates deeper to the sealant 23.

Figure 14:
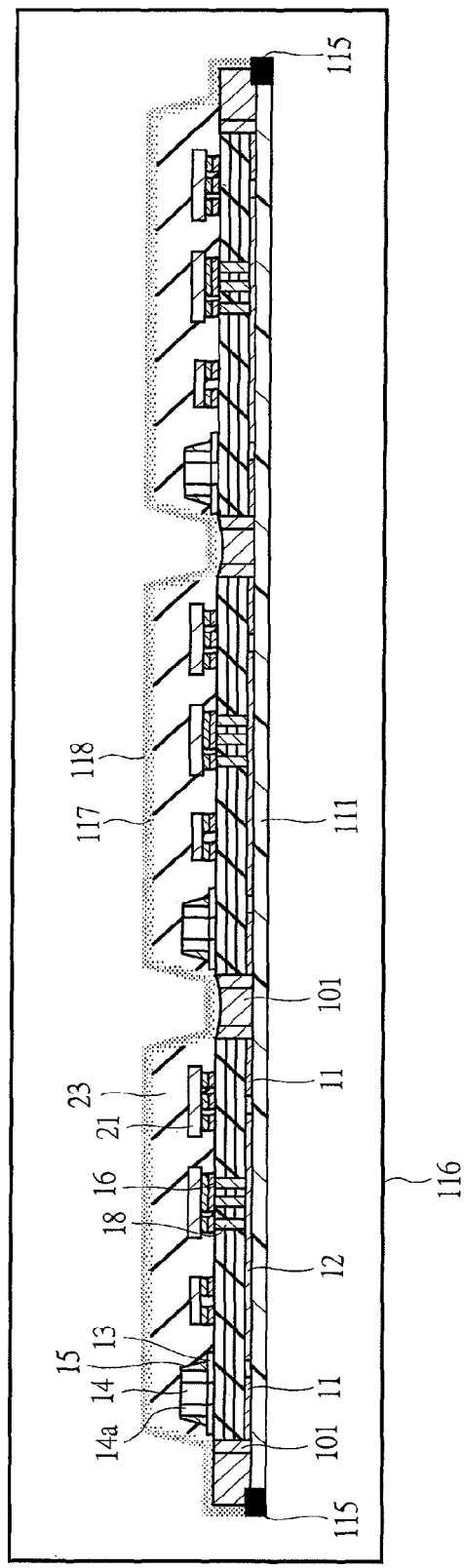
FIG. 14 is an explanatory diagram for describing the method of manufacturing the shielded electronic component according to the fourth embodiment of the present invention.
Figure 15:
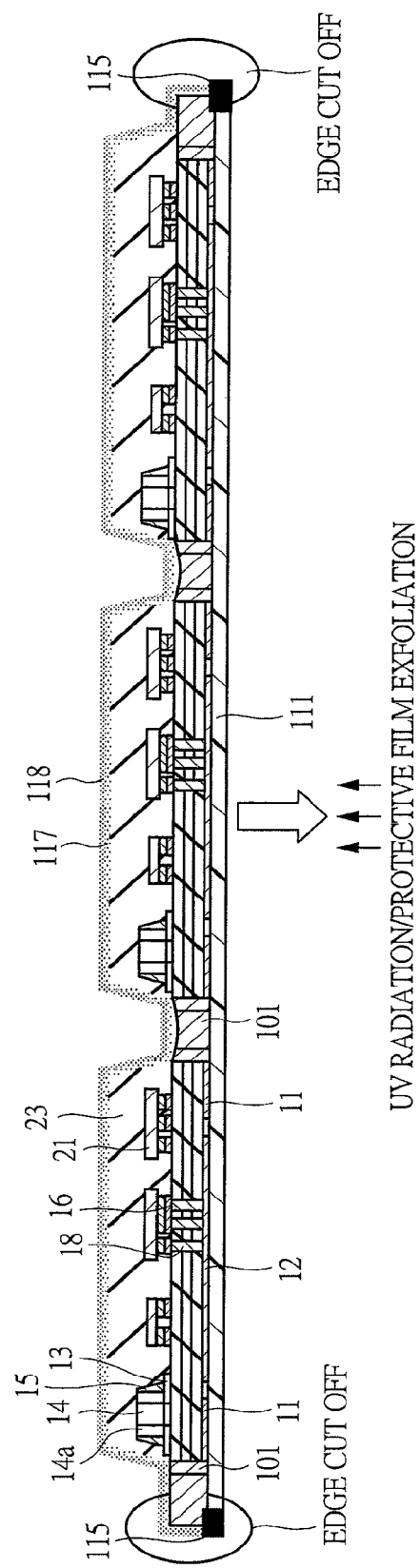
FIG. 15 is an explanatory diagram for describing the method of manufacturing the shielded electronic component according to the fourth embodiment of the present invention.

After the plating treatment illustrated in FIG. 14, the adhered portion of the periphery is cut off as illustrated in FIG. 15 and the protective film 111 is exfoliated by UV radiation.

After that, in the same manner with FIG. 9 of the first embodiment, the each sheet is cut into singulated pieces by full-cut dicing.

Also in the present embodiment, as the same manner with the first embodiment, the electronic component manufactured in the manner as described above to be a package with a electromagnetic noise shield which is not affected by noise from other semiconductors and does not let own noise out to the outside, the electric component having a plating film having a dramatically improved adhesiveness formed by forming the plating base under high-pressure $CO_2$, and having a shield with a high reflow resistance reliability on one surface can be provided.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention relates to a shielded electronic component and a method of manufacturing the same, and as to mounting of an electronic component including semiconductor, the present invention can be widely applied to a semiconductor-mounting electronic component which requires a shield structure to avoid adverse effects of radio waves from the surrounding and the electromagnetic noise from the semiconductor, a semiconductor-mounting electronic component which requires a shielding of noise generated from itself, and so forth.

What is claimed is:

1. A semiconductor device comprising:
   a wiring substrate having a first main surface, a second main surface opposite the first main surface, and a plurality of side surfaces between the first and second main surfaces in a thickness direction thereof and including a plurality of wiring layers between the first and second main surfaces;
   a first semiconductor chip mounted on the first main surface of the wiring substrate and electrically connected to the wiring substrate; and
   a sealing body including a resin and a plurality of $SiO_2$ particles, the sealing body sealing the first main surface of the wiring board and the first semiconductor chip,
   wherein a surface of the sealing body is covered by a plurality of metal plating layers,
   wherein the plurality of metal plating layers has a Pd plating layer formed on the surface of the sealing body and a Ni plating layer formed on and in direct contact with the Pd plating layer,
   wherein a part of the Pd plating layer permeates into holes and spaces defined by interfaces of the resin and the plurality of $SiO_2$ particles of the surface of the sealing body,
   wherein a ground connection through-hole is formed at one of a plurality of side surfaces of the wiring substrate, and the ground connection through-hole is electrically connected to an end portion of a ground wiring layer of the plurality of wiring layers, and
   wherein the plurality of metal plating layers extends to and contacts with the ground connection through-hole and the plurality of metal plating layers are electrically connected to the ground wiring layer.

2. The semiconductor device according to claim 1, wherein the Pd plating layer is formed using high-pressure $CO_2$.

3. The semiconductor device according to claim 2, wherein the Ni plating layer is formed using high-pressure $CO_2$.

4. The semiconductor device according to claim 1, wherein a part of the holes of the surface of the sealing body is caused by vacancy of $SiO_2$ particles.

5. The semiconductor device according to claim 1, wherein a plurality of passive components are mounted on the first main surface of the wiring substrate and are sealed by the sealing body.

6. The semiconductor device according to claim 5, wherein the first semiconductor chip includes a power amplifier circuit.

7. The semiconductor device according to claim 1, wherein the ground connection through-hole extends to the first and second main surfaces of the wiring substrate, and
   wherein the plurality of metal plating layers contacts with the ground connection through-hole at a first main surface side.

8. The semiconductor device according to claim 1, wherein a second semiconductor chip is mounted over the first semiconductor chip, and wherein the second semiconductor chip is electrically connected to the wiring substrate.

9. The semiconductor device according to claim 1,
wherein a plurality of terminals is formed on the second main surface of the wiring substrate, and
wherein solder is disposed on each of the plurality of terminals.

\* \* \* \* \*